(12) United States Patent
Park et al.

(10) Patent No.: US 6,734,109 B2
(45) Date of Patent: May 11, 2004

(54) METHOD OF BUILDING A CMOS STRUCTURE ON THIN SOI WITH SOURCE/DRAIN ELECTRODES FORMED BY IN SITU DOPED SELECTIVE AMORPHOUS SILICON

(75) Inventors: Heemyong Park, LaGrangeville, NY (US); Fariborz Assaderaghi, San Diego, CA (US); Jack A. Mandelman, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 138 days.

(21) Appl. No.: 09/924,318

(22) Filed: Aug. 8, 2001

(65) Prior Publication Data
US 2003/0032295 A1 Feb. 13, 2003

(51) Int. Cl.⁷ .............................................. H01L 21/302
(52) U.S. Cl. ...................... 438/700; 438/701; 438/703; 438/713; 438/723; 438/724
(58) Field of Search ................................. 438/700, 701, 438/703, 713, 723, 724

(56) References Cited

U.S. PATENT DOCUMENTS

| | | | |
|---|---|---|---|
| 5,674,777 A | | 10/1997 | Chen et al. |
| 5,824,586 A | | 10/1998 | Wollesen et al. |
| 5,864,161 A | | 1/1999 | Mitani et al. |
| 5,967,794 A | | 10/1999 | Kodama |
| 6,001,697 A | | 12/1999 | Chang et al. |
| 6,013,928 A | | 1/2000 | Yamazaki et al. |
| 6,015,740 A | | 1/2000 | Milic-Srkalj |
| 6,051,473 A | | 4/2000 | Ishida et al. |
| 6,090,691 A | | 7/2000 | Ang et al. |
| 6,091,117 A | | 7/2000 | Shiozawa et al. |
| 6,121,091 A | * | 9/2000 | Wang .......................... 438/275 |
| 6,124,155 A | | 9/2000 | Zhang et al. |
| 6,137,129 A | * | 10/2000 | Bertin et al. ................. 257/302 |
| 6,323,103 B1 | * | 11/2001 | Rengarajan et al. ......... 438/424 |
| 6,346,729 B1 | * | 2/2002 | Liang et al. ................. 257/344 |
| 6,448,140 B1 | * | 9/2002 | Liaw ........................... 438/279 |

* cited by examiner

Primary Examiner—Nadine G. Norton
Assistant Examiner—Binh X. Tran
(74) Attorney, Agent, or Firm—Whitham, Curtis & Christofferson, P.C.; Joseph P. Abate

(57) ABSTRACT

The present invention provides improved controllability of the lateral etch encroachment of silicon under the spacer, in light of the fact that the exemplary method, in accordance with the present invention, comprises the step of implanting neutral ions such as Ge or Ar into the source/drain regions. The implantation creates an amorphous silicon surface, and leaves a laterally extended amorphous layer under the spacer and a well defined amorphous/crystalline interface. The etch of silicon then extends laterally underneath the spacer, due to the higher etch rate of amorphous silicon and abrupt interface between amorphous and crystalline silicon.

4 Claims, 4 Drawing Sheets

METHOD OF BUILDING A CMOS STRUCTURE ON THIN SOI WITH SOURCE/DRAIN ELECTRODES FORMED BY IN SITU DOPED SELECTIVE AMORPHOUS SILICON

BACKGROUND OF THE INVENTION

1. Field of the Invention

The present invention generally relates to CMOS structures and, more particularly, to a method of forming source/drain electrodes on thin SOI by employing an in situ doped amorphous silicon epitaxy process.

2. Background Description

Complementary Metal Oxide Semiconductors (CMOS) are electronic components used for Random Access Memory (RAM)and fast data switching. CMOS semiconductors are made of two complementary metal-oxide field effect transistors for high speed and low power use. While many designs have been developed, Silicon On Insulator has recently been of interest due to the high capacity of silicon for high-performance structure fabrication having the channel controllable with low gate voltages.

As silicon film thickness of SOI is reduced, for high-performance CMOS fabrication, it becomes necessary to increase the thickness of source/drain regions above the SOI thickness. This principally results from the fact that, as the SOI film becomes thinner, there exists a reduced amount of Si material from which to form silicide for source/drain contacts. Additionally, thinner source/drain regions can degrade on-current due to increased series resistance.

In particular, when the SOI wafer is 500 Å and below, it is necessary to build raised source/drain (RSD) structures for silicided contact formation. Source/Drain series resistance is affected by the RSD layer geometry and the doping level in the layer. This is particularly difficult when dealing with PFET and NFET devices because the difference in conductivity between the PFET extension and the NFET halo creates makes it difficult to create a shallow junction and the RSD in sequential order. For sub 0.1 mm CMOS technology on thin SOI, it is necessary to build the RSD layer and shallow junction at the same time. However, the technique of forming the halo and the extension using the dopant diffusion from a solid source interface should be compatible with the requirements for RSD layer formation.

When building an advanced CMOS structure several additional problems are generally encountered. In particular, CMOS processes involving the integration of both P-type and N-type Field Effect Transistors (FETs) cannot employ the same solid source diffusion techniques used to achieve the shallow junction. Attempts have been made to use amorphous silicon as a material for the RSD layer and performing Chemical Mechanical Polishing (CMP) on either the NFET or the PFET. However, for CMOS integration, it is necessary to overcome the problem of forming the interface for solid source diffusion for the P-type and N-type FETs individually without mixing the dopants of the PFET with those of the NFET. There is an existing need for a method of controlled recess formation for NFET and PFET simultaneously.

SUMMARY OF THE INVENTION

In one aspect of the present invention, a method of forming source/drain electrodes on thin SOI is provided, which comprises an in situ doped amorphous silicon epitaxy process.

A principal objective in accordance with a preferred embodiment of the present invention, is to contemporaneously achieve a shallow junction for PFET boron extension doping and confine the distribution of NFET boron halo with steep lateral concentration profiles, by using in situ doped amorphous silicon selective epitaxy and appropriately placed removable spacers.

A further objective in accordance with a preferred embodiment of the present invention, is to build the RSD layers contemporaneously with shallow junction formation for the extension region and sharper halo profiles. In the furtherance of this and other objectives, the RSD layers are formed in conjunction with doped amorphous silicon deposition with the opposite types of doping, so that high-performance CMOS devices can be formed on very thin SOI films.

Still another objective in accordance with a preferred embodiment of the present invention is to provide improved controllability of the lateral etch encroachment of silicon under the spacer. In the furtherance of this and other objectives, the method comprises the step of implanting neutral ions such as Ge or Ar into the source/drain regions. The implantation creates an amorphous silicon surface, and leaves a laterally extended amorphous layer under the spacer and a well defined amorphous/crystalline interface. The etch of silicon then extends laterally underneath the spacer, due to the higher etch rate of amorphous silicon and abrupt interface between amorphous and crystalline silicon.

Further objects, features and advantages of the invention will be apparent from the following detailed description taken in conjunction with the accompanying drawings.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
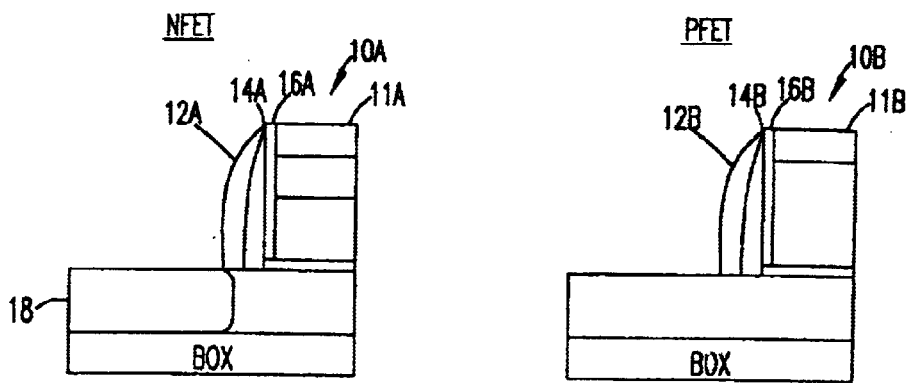
FIG. 1 shows an initial stage of formation of source/drain electrodes on thin SOI by employing an in situ doped amorphous silicon epitaxy process.

In the embodiments of the present invention, the method of forming source/drain electrodes on thin SOI comprises an in situ doped amorphous silicon epitaxy process comprising the contemporaneous achievement a shallow junction for PFET boron extension doping and confinement of the distribution of NFET boron halo with steep lateral profiles, by using in situ doped amorphous silicon selective epitaxy and appropriately placed removable spacers. Furthermore, the method comprises the combined step of building the RSD layers and the formation of the shallow junction for the extension region and sharper halo profiles.
Method of Formation of the Present Invention Referring now to the drawings, and to FIGS. 1–15 generally, there is shown several stages of formation of source/drain electrodes on thin SOI by employing an in situ doped amorphous silicon epitaxy process. The fabrication process shown in the figures describe several embodiments, which are not all necessarily required in any one preferred embodiment but which still may be part of the present invention.

In FIG. 1, after forming the gate stack 10a and 10b with preferably a nitride buffer layer 11a and 11b on top, removable spacers are formed at the sidewall 16a and 16b. Therefore, in FIG. 1, insulating materials are formed along the sidewalls 16a and 16b.

These insulating materials may include, but are not limited to, an oxide as well as silicon nitride. The silicon nitride may be used for the formation of silicon nitride spacers, and may be isotropically deposited using an isotropic etch such as reactive ion etching (RIE) techniques. A conformal silicon nitride layer may be deposited on the oxide layer. The conformal nitride layer may also be formed over the active area and the isolation areas between the active areas.

The thickness of nitride 11a and 11b can be adjusted. Spacers are introduced, beginning with the nitride spacer 12a and 12b and then oxide spacer 14a and 14b. TEOS may be utilized, or an alternative, yet suitable oxide spacer should be apparent to one of ordinary skill in the art. Subsequently, NFET source/drain dopant 18 is implanted by methods known in the art.

Figure 2:
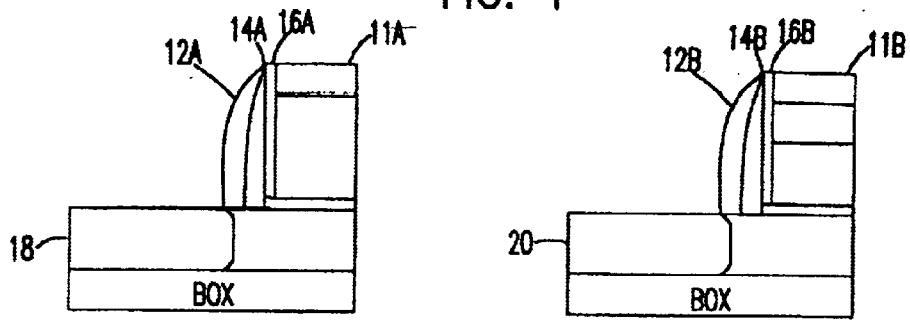
FIG. 2 shows an intermediate stage of formation of source/drain electrodes on thin SOI by employing an in situ doped amorphous silicon epitaxy process.

Optionally, a Rapid Thermal Anneal (RTA) is used at this point for dopant activation. A typical RTA may be performed at approximately 900–1000° C. for 5–30 seconds in either Ar or $N_2$. Referring now to FIG. 2, PFET source/drain 20 implantation is performed in a standard manner.

Figure 3:
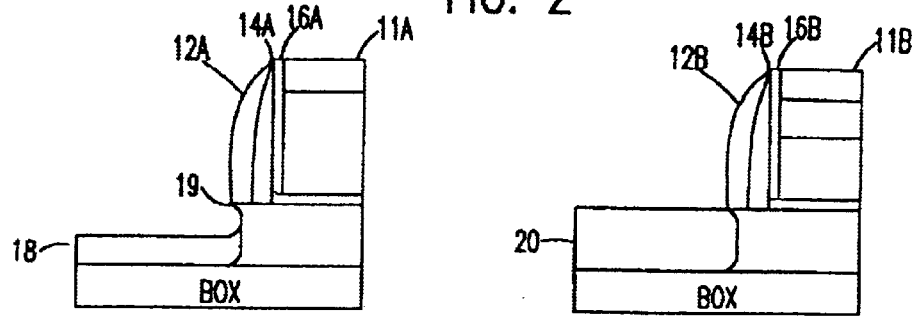
FIG. 3 shows an intermediate stage of formation of source/drain electrodes on thin SOI by employing an in situ doped amorphous silicon epitaxy process.

In FIG. 3, the PFET may be masked with photo resist and the NFET source drain region 18 is etched, preferably by RIE techniques. This allows enhanced control of the lateral encroachment of silicon under the spacer when either RIE techniques or Ge pre-amorphization is utilized. Pre-amorphization, as applied in FIG. 3, principally refers to harnessing the high etch rate of amorphous silicon and the abrupt interface between amorphous and crystalline silicon to extend the silicon etch 19 laterally underneath the spacer 12a and preferably, but not necessarily, a substantial portion of 14a.

Figure 4:
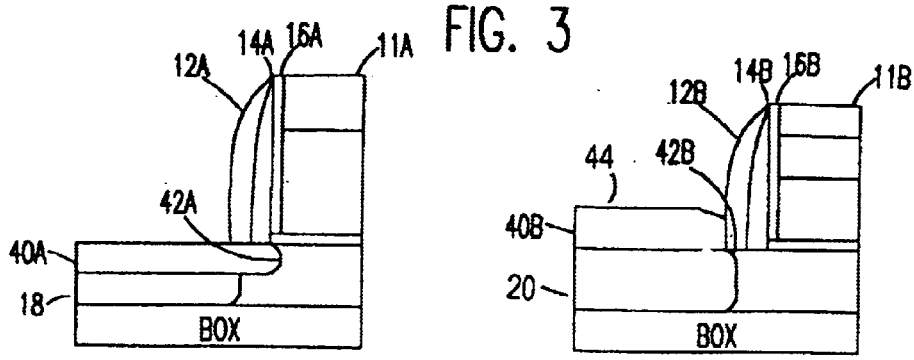
FIG. 4 shows an intermediate stage of formation of source/drain electrodes on thin SOI by employing an in situ doped amorphous silicon epitaxy process.

Referring now to FIG. 4, selective epitaxial growth of boron doped amorphous silicon 40a and 40b is shown on both the NFET and the PFET, respectively. In order to make this possible, the boron concentration target is around NFET halo doping on the order of about 1E18 $cm^{-3}$. On the NFET, the growth occurs at the recessed interface 42a, whereas the RSD layer 44 is contemporaneously formed on the PFET. Due to the amorphous/crystalline interface and the lack of channeling and damage from implantation, a very abrupt boron doping profile of about 200 Å can be achieved near the interface 42b.

Figure 5:
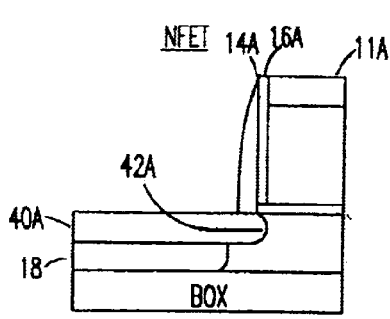
FIG. 5 shows an intermediate stage of formation of source/drain electrodes on thin SOI by employing an in situ doped amorphous silicon epitaxy process.
Figure 5:
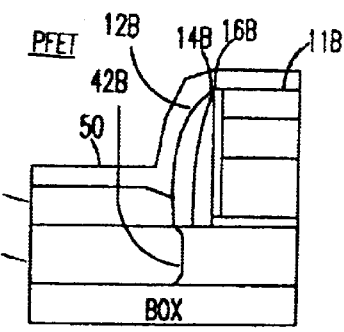

In FIG. 5, a tetraethylorthosilane (TEOS) layer 50 or other suitable oxide is deposited on the NFET and possibly a portion of the PFET using plasma enhanced chemical vapor deposition (PECVD) or other suitable deposition technique. After masking of the PFET region with photo resist, all oxide, including the spacer, is etched on the NFET.

Figure 6:
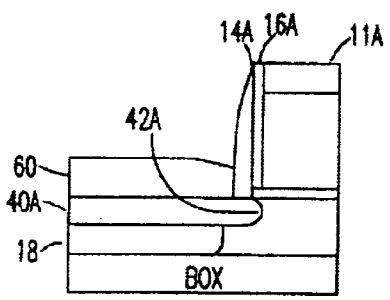
FIG. 6 shows an intermediate stage of formation of source/drain electrodes on thin SOI by employing an in situ doped amorphous silicon epitaxy process.
Figure 6:
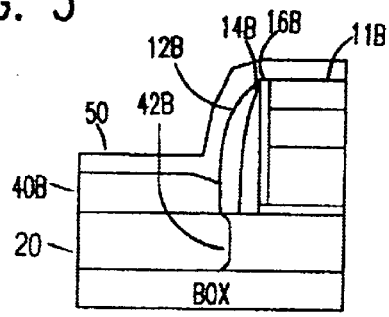
Figure 7:
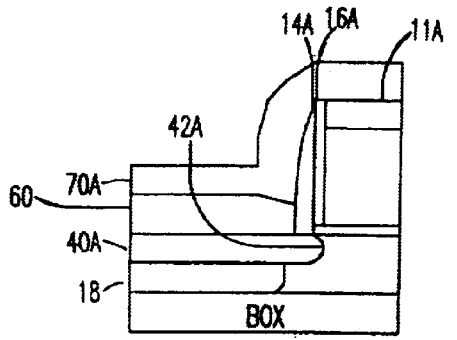
FIG. 7 shows an intermediate stage of formation of source/drain electrodes on thin SOI by employing an in situ doped amorphous silicon epitaxy process.
Figure 7:
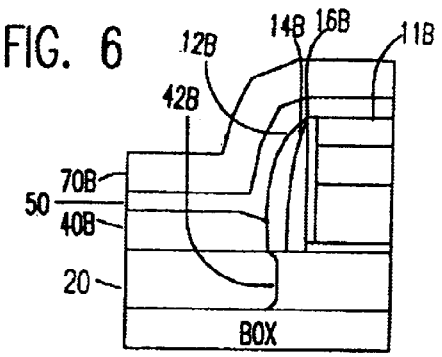
Figure 8:
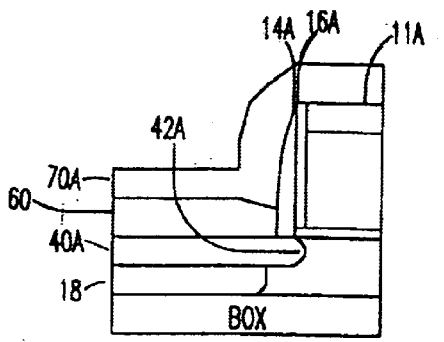
FIG. 8 shows an intermediate stage of formation of source/drain electrodes on thin SOI by employing an in situ doped amorphous silicon epitaxy process.
Figure 8:
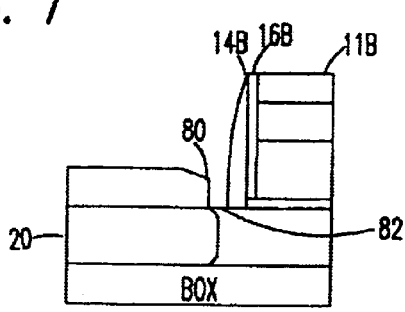

FIG. 6 shows undoped selective epitaxy formed on the NFET to make RSD regions 60. The oxide 50 covering the PFET regions prevents epitaxial growth on the PFET. Subsequently, another thin layer of oxide 70a and 70b (e.g., TEOS) is deposited on both the NFET and PFET. See FIG. 7.

Figure 9:
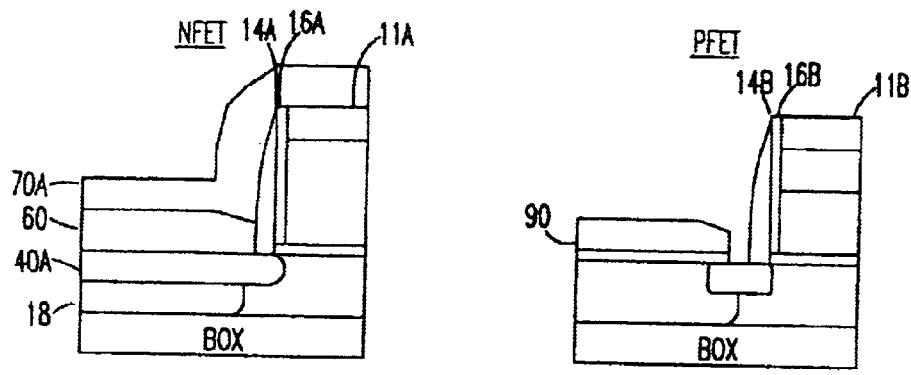
FIG. 9 shows an intermediate stage of formation of source/drain electrodes on thin SOI by employing an in situ doped amorphous silicon epitaxy process.

After masking the NFET region, all of the oxide on the PFET is etched, by conventional methods, namely the first 50 and second 70b thin TEOS layers and the oxide spacer 14b. See FIG. 8. This leaves the notched region 80 for the PFET extension notch 82 formation. As shown in FIG. 9, The PFET halo 90 is formed, preferably by the implantation of arsenic.

Figure 10:
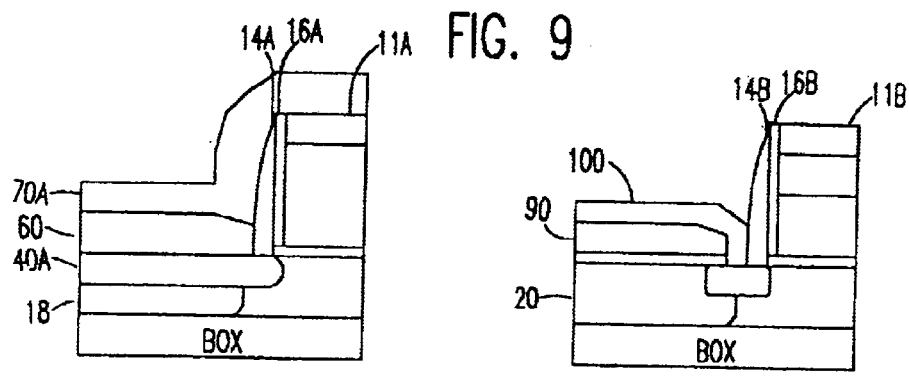
FIG. 10 shows an intermediate stage of formation of source/drain electrodes on thin SOI by employing an in situ doped amorphous silicon epitaxy process.

Referring now to FIG. 10, selective epitaxy is performed on the PFET region using in situ boron doped amorphous silicon 100, which fills the extension notch 82 with high concentration of boron. In order to effectively form the PFET extension electrodes, the boron concentration is relatively high, preferably approximately 1E20 $cm^{-3}$ or greater.

Figure 11:
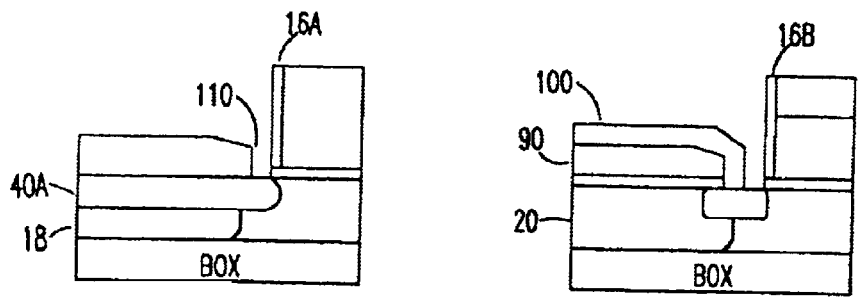
FIG. 11 shows an intermediate stage of formation of source/drain electrodes on thin SOI by employing an in situ doped amorphous silicon epitaxy process.
Figure 12:
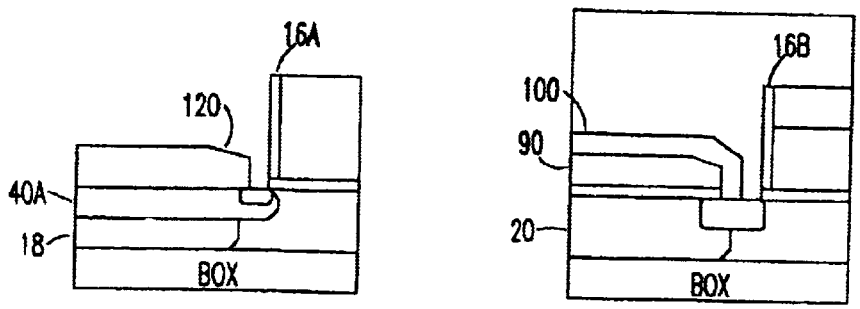
FIG. 12 shows an intermediate stage of formation of source/drain electrodes on thin SOI by employing an in situ doped amorphous silicon epitaxy process.

FIG. 11 shows etching off the oxide 14a and 70a on the NFET only while etching the nitride layer off of all regions, including nitride spacer 14a and 14b and the buffer nitride 11a and 11b on top of the gate poly. N-extension 120 is performed, preferably with arsenic implantation through the notch 110 formed as a result of nitride spacer 14a removal. See FIG. 12.

Figure 13:
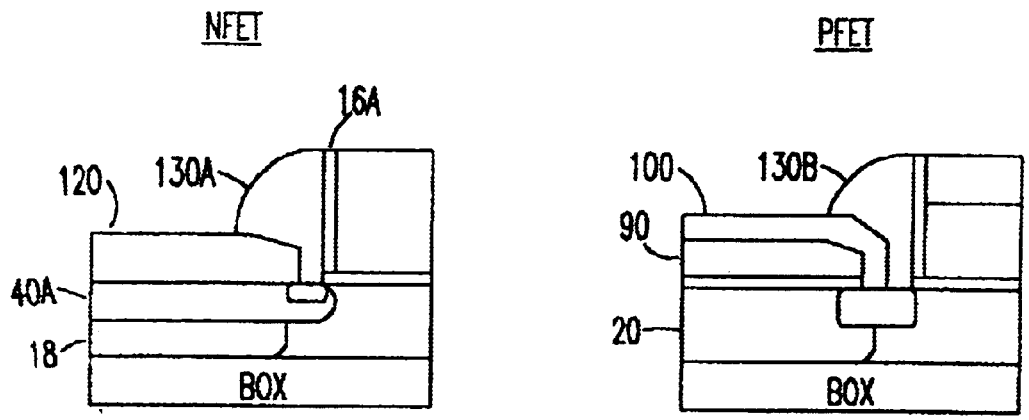
FIG. 13 shows an intermediate stage of formation of source/drain electrodes on thin SOI by employing an in situ doped amorphous silicon epitaxy process.

FIG. 13 shows the formation of permanent spacers 130a and 130b using a low temperature technique. This process is preferably performed using a chemical vapor deposition (CVD) tooling process, more preferably, plasma enhanced chemical vapor deposition (PECVD) at a suitable temperature, preferably, about 600° C. or lower. The spacer is suitably configured to fill the notch on both PFET and NFET.

Figure 14:
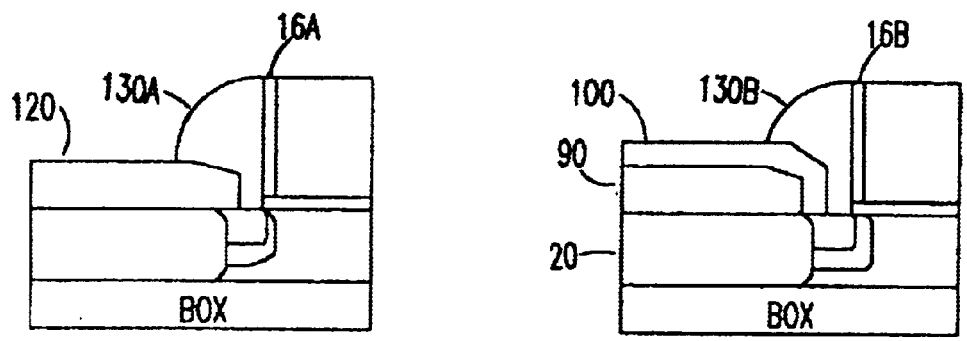
FIG. 14 shows an intermediate stage of formation of source/drain electrodes on thin SOI by employing an in situ doped amorphous silicon epitaxy process.
Figure 15:
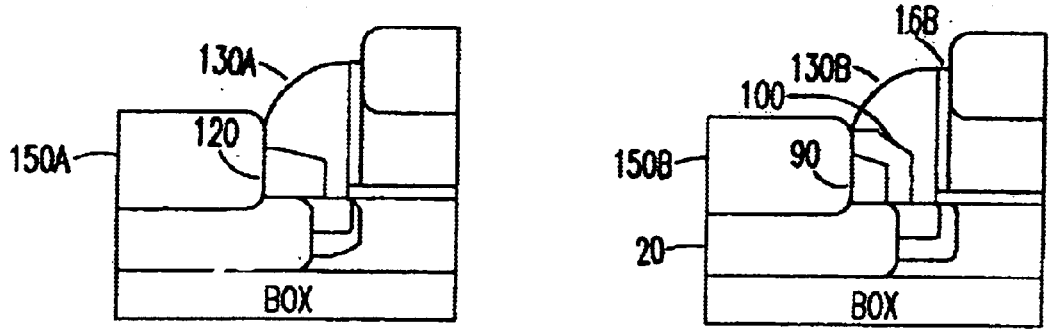
FIG. 15 shows a substantially completed source/drain electrodes on thin SOI by employing an in situ doped amorphous silicon epitaxy process.

Referring now to FIG. 14, a final anneal, preferably RTA, is performed to active all of the dopants. Since boron diffusivity is higher than that of arsenic, the P-extension boron diffuses to form the extension overlap with the gate, while there is not significant N-extension arsenic/gate overlap during the final thermal cycle. The deep source/drain dopants are activated, and redistributed inside the RSD regions, along with extension doping. Since the diffusion of boron from the doped amorphous layer is minimal, a very steep boron profile gradient is achieved in the NFET halo and PFET extension. Finally, as shown in FIG. 15, silicidation 150a and 150b on the RSD on a very thin Silicon On Insulator (SOI) wafer. Conventional back end processing is then performed.

In view of the foregoing, it is seen that an exemplary embodiment in accordance with the present invention provides a method of forming source/drain electrodes on thin SOI comprising an in situ doped amorphous silicon epitaxy process. The exemplary method contemporaneously achieve a shallow junction for PFET boron extension doping and confine the distribution of NFET boron halo with steep lateral concentration profiles, by using in situ doped amorphous silicon selective epitaxy and appropriately placed removable spacers.

The method facilitates the building of the RSD layers contemporaneously with shallow junction formation for the extension region and sharper halo profiles by forming the RSD layers in conjunction with doped amorphous silicon deposition with the opposite types of doping, so that high-performance CMOS devices can be formed on very thin SOI films.

In can also be appreciated that improved controllability of the lateral etch encroachment of silicon under the spacer is provided in light of the fact that the exemplary method, in accordance with the present invention, comprises the step of implanting neutral ions such as Ge or Ar into the source/drain regions. The implantation creates an amorphous silicon surface, and leaves a laterally extended amorphous layer under the spacer and a well defined amorphous/crystalline interface. The etch of silicon then extends laterally underneath the spacer, due to the higher etch rate of amorphous silicon and abrupt interface between amorphous and crystalline silicon.

While the invention has been described in terms of preferred embodiments, those skilled in the art will recognize that the invention can be practiced with modification within the spirit and scope of the appended claims.

What is claimed is:

1. A method of forming a raised source/drain field effect transistor structure including a PFET and an NFET including the steps of:

forming gate structures including dual spacers at gate regions of a substrate;

etching said substrate adjacent said gate region sufficient for silicidation of contacts in said substrate;

growing boron doped amorphous silicon on NFET and PFET regions, adjacent said gate region, by selective epitaxy;

forming an abrupt source/drain junction for PFET boron extension electrode and NFET boron halo formation adjacent said gate region; and selectively etching said dual spacers at said source/drain junction.

2. The method of claim 1, further comprising the steps of:

performing N-extension arsenic implantation and p-extension boron implantation; and diffusing said arsenic and said boron such that said PFET extension electrode overlaps the gate region.

3. The method of claim 2, where the N-extension arsenic does not substantially overlap the gate region.

4. The method of claim 1, further comprising the step of performing selective amorphous growth to form the source/drain junction.

\* \* \* \* \*